Figure 1:
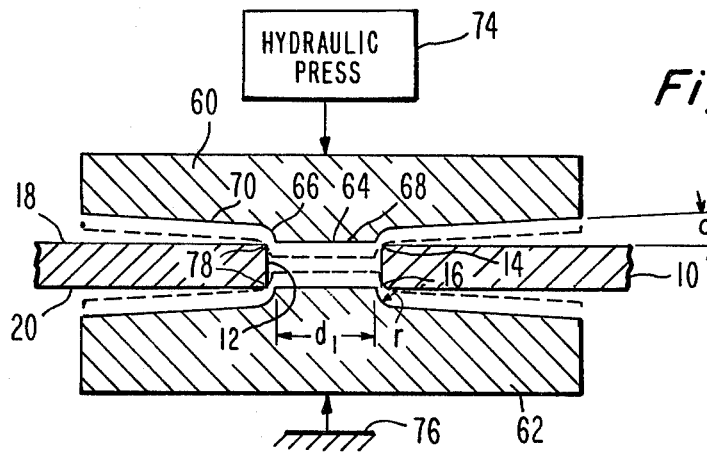

United States Patent [19]

Whitley

[11] 4,248,075
[45] Feb. 3, 1981

[54] METHOD OF FORMING APERTURE WITH ROUNDED EDGES IN SHEET MATERIAL

[75] Inventor: George J. Whitley, Philadelphia, Pa.

[73] Assignee: RCA Corporation, New York, N.Y.

[21] Appl. No.: 36,189

[22] Filed: May 4, 1979

[51] Int. Cl.$^3$ .................... B21D 28/26; B21D 37/10
[52] U.S. Cl. ................................. 72/335; 29/829; 72/327; 72/412; 72/416
[58] Field of Search ............... 72/334, 333, 335, 327, 72/412, 416, 464, 470, 407, 408; 29/829, 846, 558; 76/107 S, 107 A, 107 R; 113/121 B, 121 R

[56] References Cited

U.S. PATENT DOCUMENTS

| 2,737,831 | 3/1956 | Webb | 72/327 |
| 3,455,138 | 7/1969 | Zapf | 72/412 X |
| 3,943,745 | 3/1976 | Paul | 72/335 |

FOREIGN PATENT DOCUMENTS

| W 9649 | 1/1956 | German Democratic Rep. | 72/412 |
| 44-153 | 1/1969 | Japan | 72/416 |

OTHER PUBLICATIONS

"Porcelain-On-Steel", Spector, Electronics, Mar. 15, 1979, pp. 125–128.

"Porcelain-On-Steel Makes Progress", Electronics, Mar. 1, 1979.

"New Substrate Causes Stir", Lyman, Electronics, Dec. 7, 1978, p. 94.

Primary Examiner—Milton S. Mehr
Attorney, Agent, or Firm—Samuel Cohen; William Squire

[57] ABSTRACT

A procelain on steel printed circuit board includes apertures whose edges are rounded. An aperture is formed by first punching or otherwise making an aperture in the uncoated steel of somewhat larger size than desired, then employing a pair of dies, each with rounded shoulders and a center region of smaller area than the aperture. When the board is placed between the dies with the center region of the latter aligned with an aperture, and pressure is applied to the dies, they engage and round the edges of the aperture. The excess displaced material is forced into space between the original peripheral edge of the aperture and the center region of the dies, thereby decreasing the size of the aperture to the desired size and forming a relatively smooth tapered transition region between opposite surfaces of the board and the outer circumference of the aperture of reduced size. The steel is coated with porcelain after the finished apertures are formed.

6 Claims, 9 Drawing Figures

U.S. Patent     Feb. 3, 1981     4,248,075

METHOD OF FORMING APERTURE WITH ROUNDED EDGES IN SHEET MATERIAL

The present invention relates to a coining process for rounding the edges of a hole in sheet material and particularly in an insulated steel printed circuit board.

Porcelain coated steel is coming into relatively wide use as substrates for thick film hybrid circuits and printed circuits. It has excellent mechanical and thermal properties and is relatively low cost. This material is extremely rugged, being made of metal, it is its own heat sink and ground plane, and can support large numbers of microcircuit chips. Conductive and resistive elements can be fired at high temperatures directly onto the board avoiding the plating and etching processes and component assembly steps in other types of printed circuits. The metal substrate can be formed readily and after coating with a suitable enamel or porcelain can withstand harsh environments which are deleterious to other printed circuit board materials.

A porcelain coated steel substrate has a core of low carbon steel and a coating of fired-on porcelain enamel. The enamel has a sufficiently high firing temperature to permit hybrid components to be fired onto the coating at 650° C. Conductors are silk screened onto the surface of the board and may be of copper, silver, palladium-silver, platinum-silver nickel, gold or any other metal used in a screenable ink. Resistors may also be screened onto the surface of the board.

Because silk screening is the most widely used process for depositing conductors and components onto the surface, the surface must be extremely flat to provide good process control of the component thickness. For example, slight bulges or surface variations may result in undesirable variations in thickness of a thick film resistor screened onto the surface. Additionally, the porcelain coating on the steel substrate must be of sufficient thickness over all parts of the substrate to prevent short circuits between the ground plane formed by the steel board and components which may be mounted on the board.

For the above reasons, the formation of holes in the board for receiving leads of components is extremely critical. The walls and edges of the holes in the substrate must all be coated with a sufficient thickness of porcelain to prevent any metal to metal contact between the substrate and the lead inserted in the hole.

Present attempts to overcome the problems with the hole have been directed in efforts to round the holes. That is, it has been found that sharp edges or corners at the hole do not get sufficiently coated by the enamel layer. This results in the base material (metal) protruding through the enamel at the holes. Attempts have been made to round the holes by use of dies and punches. However, these attempts are not fully successful. They distort the material around the holes and cause bulges and uneven surface conditions which result in even more unevenness when the enamel is deposited over the metal surface. Also while some of the edges may be rounded, others remain sharp. Some efforts have been directed to beveling the edges by using drilling machines. However, this is slow and costly, especially in view of the fact that some circuit boards may have numerous holes. In addition, some holes are not round but square or oblong, or of other non-circular shapes, and these cannot be beveled with drilling machines.

In accordance with the present invention, an aperture is formed in a sheet of steel and the walls of the aperture are rounded so that the walls in section form a continuous curve whose tangents gradually rotate in a given direction from the intersections of the walls with one surface of the sheet to the intersection of the walls with the other surface of the sheet on the opposite side of the sheet as the one surface.

Figure 2A:
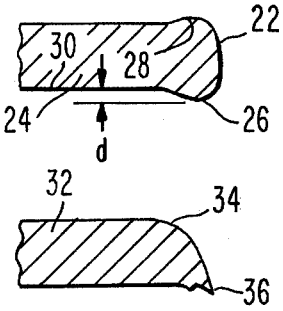
Figure 2B:
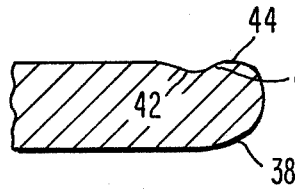
Figure 2C:
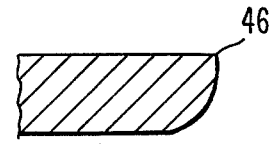
Figure 2D:
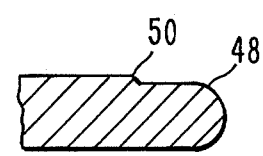
Figure 3:
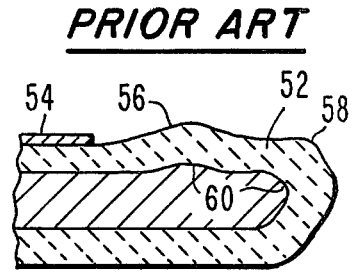
Figure 4:
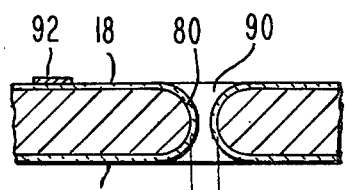
Figure 5:
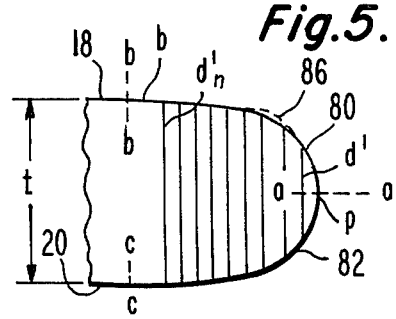

In the drawing:

FIG. 1 is a sectional side elevation view of a coin punch coining a steel substrate to be used as a printed circuit board, FIGS. 2A–2E are sectional views of a hole formed by prior art processes, FIG. 3 is a sectional elevation view of a hole formed by a prior art process with an insulating coating on it, FIG. 4 is a sectional elevation view of a hole formed in accordance with the present invention, and FIG. 5 is an enlarged sectional end view of a side wall of a hole formed in accordance with the present invention.

In FIG. 1 a substrate 10, preferably a low carbon sheet steel, is formed with one or more holes 12 of circular, square, rectangular, oblong, or other shape. Hole 12 is formed with relatively sharp corners 14 and 16 at the edges of the hole 12 which intersect with the respective surfaces 18 and 20 of the sheet 10. The edges 14 and 16 are undesirable for a sheet of steel used in a printed circuit board application by reason of the fact that the porcelain enamel coating to be later applied does not fully cover the sharp edges and therefore the base metal at 14 and 16 protrudes through the coating and may cause malfunctions of circuits which include components mounted in the holes 12.

Previous attempts to cope with these sharp corners have met with little success. In FIG. 2A attempts to coin a hole 22 in a sheet 24 has displaced the material at 26 and 28, forming bulges which extend a distance d above the surface 30 of the sheet. These bulges are unacceptable for they interfere with the silk screening of printed resistors and circuit paths onto the surface 30. Further, each distortion present at 26 may result in a thinner coating of the porcelain enamel at this location and result in a possible short circuit between the base metal at this location and an overlying component.

In FIG. 2B sheet 32 was coined at 34 by a punch. However, a sharp burr 36 remains at the opposite corner of the sheet 32. Some prior art manufacturers do not remove the burr 36 and this results in the metal base material protruding through a subsequently applied enamel coating causing possible circuit malfunctions.

FIG. 2C illustrates another sectional view of a hole rounded in accordance with prior art methods. Here, the one edge at 38 is rounded but surface irregularities are present at 40 which interfere with the silk screening to an extent that it would prevent satisfactory use of the board. The depression at 42 would get an extra thick coating of silk screen material, while the high areas at 44 may result in an overly thin coating of silk screen material, Also, the area at 44 may be sufficiently sharp to result in possible overly thin coating of insulating porcelain enamel which may result in subsequent circuit malfunction. FIG. 2D is somewhat similar to the FIG. 2B in section except there is no burr at the corner 46; however, the corner 46 is sufficiently sharp to prevent adequate coating by the porcelain enamel and may result in circuit malfunction. In FIG. 2E the edges of the hole at 48 have been rounded but a step at 50 caused by the die results in a sufficiently sharp corner such that the porcelain coating may not cover this area properly. Further, there is a difference in surface flatness here which would result in a silk screening problem as discussed above.

In FIG. 3, a section of steel with an undesirable rounded corner is shown coated with coating 52 with a circuit 54 which is printed on the coating. Note that the coating at 56 and 58 is nonuniform in thickness and height due to the nonuniformities at 60 in the substrate. The coating magnifies the nonuniformities in the substrate. The nonuniformities, of course, interfere with the silk screening process.

These problems with the prior art are overcome by the coining process of the present invention in which two dies 60 and 62 are provided. The dies 60 and 62 are each identical in shape and are mirror images of each other. In the present example, assume hole 12 is circular, in which case the center regions 64 of the dies also will be circular, and will have a diameter $d_1$ smaller than the diameter of the hole 12. If the hole were square or rectangular, or whatever shape, the region 64 would be of similar shape and its area would be somewhat smaller than that of the hole. The center region 64 is employed to define the inside dimensions of the finished hole, as explained shortly. Each die tapers in a smooth curve 66 which extends from the peripheral edge of the center region to the main face (surface 70) of the die. The curve has a radius r at the region thereof which engages the corner of the hole and as the curve merges into the flat surface 70, its radius of curvature increases. An example of a typical value of r is given later. The surface 70 extends at an angle $\alpha$ from the surface 18 of the substrate. The angle $\alpha$ is important. If it is too large or too small, the edges of hole 12 may not round properly. In practice, an angle $\alpha$ of about 2°–3° was found to give satisfactory results for the low carbon sheet steel material which was being coined. With this material, it was found that when $\alpha$ was 4°, bulges such as at 26, FIG. 2A could be produced. It was also found that when $\alpha$ was 1° or less, a step as at 50, FIG. 2E, could be produced. Other materials may require a different angle range for $\alpha$ to obtain optimum performance.

In operation, first an aperture of somewhat larger diameter than $d_1$ is made in the sheet 10 by punching, stamping or in some other way. This aperture will have edges at a sharp angle as shown, for example, in FIG. 1 or in any case in some undesired rough configuration not suitable for the application thereto of a porcelain coating. The sheet is then placed between a pair of dies as shown in FIG. 1 and a hydraulic press 74 is employed to force the die 60 toward die 62 which is mounted on a fixed support 76. The two dies 60 and 62 thereby engage the sheet at the corners 78 of the hole 12 and cause these corners to assume the rounded shape desired. The dies also cause the material formerly at the corners to flow along surfaces 66 into the gap between surfaces 66 and the surface of the side wall of the hole 68. Surfaces 70 on the dies compress the surfaces 18 and 20 of substrate 10 an amount sufficient to also flow material toward the diameter $d_1$. Thus, it is recognized that in rounding the corners excess material is produced from the rounded surfaces. The smaller diameter $d_1$ is provided in area 64 to permit the excess material to flow into the space between the dies 60 and 62 and diameters $d_1$ and the former walls of the hole 12 in the undeformed state. The dashed lines in FIG. 1 show the position of the dies 60 and 62 during the compression cycle; (however, for the sake of a more realistic showing, the lower die, which actually remains stationary, is shown by dashed line above its solid line position, it being understood that in practice, it is the upper die 60 and the steel sheet 10 which are moved).

Summarizing the operation described above, the dies 60 and 62 reduce the diameter of the hole 12 to a diameter approaching diameter $d_1$. As a result, no excess material is present to form the bulge or bulges as shown in FIGS. 2A and 2C. Also, by tapering surface 70, a gradual slope is provided between surfaces 18 and 20 of the substrate and the rounded edge to prevent an upward bulge as shown at 26 in FIG. 2A or a step as shown in FIG. 2E. The resulting rounded hole appears as shown in FIG. 4. Here the surface 80 of the hole is a continuous curve which gradually blends in with surface 18 of the substrate and curves continuously and smoothly blending in with surface 20 on the opposite side of the substrate. FIG. 4 also shows in a schematic way, the porcelain coating 90 at the hole (applied after the corners are finished) and a printed circuit element 92.

In FIG. 5 sectional lines $d'$–$d'_n$ are taken through the sheet from the point p which is at the interface of surface 80 with surface 82 along lines a—a, to represent the deformed surface 18 and 20, respectively, after coining. The lines b—b on surface 18 and c—c on surface 20 represent the uncoined area. It is seen that the lines $d'$ to $d'_n$ increase in length, starting from point p, the section through the sheet being one of gradually and smoothly increasing thickness, measured from point p, the curve gradually merging into the opposite parallel surfaces 18 to 20 of the sheet. In effect, a tangent to the surface 18 would rotate continuously in the same angular direction as it progresses from surface 18 to surface 20 past a—a.

While a continuous surface lying on a curve is shown between surface 18 and 20, it will be apparent that if the thickness t were sufficiently great, then the curve lying between b—b and a—a may form one "corner" of the hole and the curve lying between a—a and c—c would form the second corner. The interface between these two surfaces may be a plane surface. The significant factor of interest is the gradual sloping of the surfaces and gradual merging of the surfaces into each other without significant angular changes in direction and without sharp corners.

Some slight imperfections in the surface, of course, are permissible, such as the intersection of two surfaces which form a relatively large obtuse angle therebetween which approach a smooth continuous surface. This is shown dashed in FIG. 5 at 86. This is acceptable. For practical purposes, a slight imperfection at 86 still does not substantially affect the continuous decreasing section through the sheet from $d'_n$ to $d'$.

In one example, the dies, at surface 66, are formed with relatively a small radius r, FIG. 1, of about 0.015 inch for a sheet metal thickness of 0.035 inch. The surface 68 has a diameter $d_1$ of 0.58 inch. The hole 12 has a diameter of 0.061 inch. Surfaces 68 of the dies 60 and 62 are spaced from each other 0.003 inch when in the closed position shown dashed in FIG. 1. The surface 70 of the dies tapers in a plane surface at a 3° angle ($\alpha$ FIG. 1) with the plane of surfaces 18 and 20 of the sheet 10. The 3° taper extends until the surface 70 is at least 0.020 inch from the plane of surface 68. The hole 12 is reduced in diameter after coining by 0.003 inch by dies constructed as described.

I claim:

1. A method of forming a hole in a sheet of steel comprising:

forming an aperture of a given transverse dimension in the sheet, and rounding the surface of said aperture in a single continuous motion so that all the surface forms a continuous curve whose tangents gradually rotate in a given direction from the intersection of said aperture surface with one surface of the sheet to the intersection of the aperture surface with the other surface of said sheet on the opposite side of the sheet as the one surface, said surfaces being continuous and smooth with each other within the aperture and continuous and smooth with said surfaces of said sheet beyond said aperture such that the section of said sheet beyond said aperture decreases continuously at a gradually increasing rate.

2. The method of claim 4 further including the steps of coating the sheet and hole with an electrically insulating layer and forming a printed circuit on said layer.

3. A method of forming a hole in a sheet of steel comprising:

forming an aperture in the sheet, the aperture comprising a right cylinder side wall of a given transverse dimension whose longitudinal axis intersects the plane of said sheet at right angles, the intersection of said side wall and the surfaces of said sheet forming right angle corners, and the step of simultaneously squeezing said corners and flowing the material in said corners into said aperture while simultaneously compressing said flowing material into rounded surfaces which are continuous and smooth with each other within said aperture and continuous and smooth with said surfaces of said sheet beyond said aperture such that the section of said sheet beyond said aperture decreases continuously at a gradually increasing rate to a point where the material from each said corners merge and therby forming a hole having a transverse dimension smaller than said given dimension.

4. A method for forming in sheet material, an aperture with smoothly rounded edges comprising the steps of:

forming in the sheet an aperture of slightly larger size than desired and with edges which are not smoothly rounded;

placing the sheet between two dies, with the dies aligned with the aperture, each die comprising a flat center region which, when the sheet is in place, is parallel to a surface of the sheet, this center flat region having an area substantially equal to that desired of the finished aperture, and each die having rounded shoulders of the shape desired at the edges of the aperture; and applying pressure between the dies to force them toward one another with the center regions within the aperture, whereby the rounded shoulders of the dies engage the opposite surfaces of the sheet in the regions thereof surrounding the aperture and cause them to assume the rounded shape desired, the excess sheet material thereby displaced by the rounded shoulders of the dies being forced into the space between the center regions of the dies and the original peripheral edge of the aperture, whereby the size of the aperture is reduced to the desired size as defined by the center region of the dies, and the displaced sheet material thereby not substantially interfering with the rounded shape desired for the edges of the aperture.

5. A method for forming an aperture as set forth in claim 4 wherein said aperture is round and the center regions of the die are round, and wherein the diameter of the original aperture formed in the first step is slightly larger than the diameter of the center region of the dies.

6. A method for forming an aperture as set forth in claim 4 wherein said aperture is rectangular and the center regions of the die are rectangular, and wherein the side of the original apertures formed in the first step are slightly larger than the respective corresponding sides of the center regions of the dies.

* * * * *

UNITED STATES PATENT AND TRADEMARK OFFICE
CERTIFICATE OF CORRECTION

PATENT NO. : 4,248,075

DATED : February 3, 1981

INVENTOR(S) : George J. Whitley

It is certified that error appears in the above-identified patent and that said Letters Patent is hereby corrected as shown below:

Abstract, line 1, "procelain" should be --porcelain--.

Column 5, (claim 2), line 19, "claim 4" should be --claim 1--.

Column 5, (claim 3), line 41, "therby" should be --thereby--.

Signed and Sealed this

Nineteenth Day of May 1981

[SEAL]

Attest:

RENE D. TEGTMEYER

Attesting Officer

Acting Commissioner of Patents and Trademarks